(12) United States Patent
Ko et al.

(10) Patent No.: US 10,910,328 B2
(45) Date of Patent: Feb. 2, 2021

(54) SILICON WAFER MANUFACTURING METHOD

(71) Applicant: SUMCO CORPORATION, Tokyo (JP)

(72) Inventors: Bong-Gyun Ko, Tokyo (JP); Toshiaki Ono, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 16/618,899

(22) PCT Filed: Jun. 6, 2018

(86) PCT No.: PCT/JP2018/021720
§ 371 (c)(1),
(2) Date: Dec. 3, 2019

(87) PCT Pub. No.: WO2019/012866
PCT Pub. Date: Jan. 17, 2019

(65) Prior Publication Data
US 2020/0091089 A1    Mar. 19, 2020

(30) Foreign Application Priority Data
Jul. 10, 2017    (JP) .................. 2017-134916

(51) Int. Cl.
*H01L 23/00*    (2006.01)
*H01L 51/00*    (2006.01)
(Continued)

(52) U.S. Cl.
CPC ...... *H01L 23/562* (2013.01); *H01L 21/02367* (2013.01); *H01L 21/304* (2013.01);
(Continued)

(58) Field of Classification Search
CPC . H01L 23/562; H01L 23/147; H01L 23/4926; H01L 21/304; H01L 21/02367; H01L 21/02002; H01L 51/0096
(Continued)

(56) References Cited

U.S. PATENT DOCUMENTS 5,071,785 A * 12/1991 Nakazato ............ H01L 21/2007
438/457
5,855,998 A * 1/1999 Tanabe .................... B24B 37/04
428/216

(Continued)

FOREIGN PATENT DOCUMENTS

JP    03-055822    3/1991
JP    05-029325    2/1993
(Continued)

OTHER PUBLICATIONS

International Search Report issued in International Patent Application No. PCT/JP2018/021720, dated Aug. 21, 2018.
(Continued)

*Primary Examiner* — Dao H Nguyen
(74) *Attorney, Agent, or Firm* — Greenblum & Bernstein, P.L.C.

(57) ABSTRACT

Provided is a silicon wafer manufacturing method capable of reducing the warpage of the wafer occurring during a device process and allowing the subsequent processes, which have been suffered from problems due to severe warping of the wafer, to be carried out without problems and its manufacturing method. A silicon wafer manufacturing method according to the present invention is provided with calculating a target thickness of the silicon wafer required for ensuring a warpage reduction amount of a silicon wafer warped during a device process from a relationship between an amount of warpage of a silicon wafer and a thickness thereof occurring due to application of the same film stress (Continued)

to a plurality of silicon wafers having mutually different thicknesses; and processing a silicon single crystal ingot to thereby manufacture silicon wafers having the target thickness.

8 Claims, 12 Drawing Sheets

(51) Int. Cl.
    *H01L 21/02*    (2006.01)
    *H01L 23/14*    (2006.01)
    *H01L 21/304*   (2006.01)
    *H01L 23/492*   (2006.01)

(52) U.S. Cl.
    CPC ........ *H01L 23/147* (2013.01); *H01L 23/4926* (2013.01); *H01L 51/0096* (2013.01)

(58) Field of Classification Search
    USPC ................ 438/758, 457, 46, 689, 692, 693; 257/E21.113, E21.122, E21.129, E21.237, 257/E29.002
    See application file for complete search history.

(56) References Cited

U.S. PATENT DOCUMENTS

| | | | | |
|---|---|---|---|---|
| 2003/0098704 A1* | 5/2003 | Du-Nour | ............. | G01B 11/245 324/754.23 |
| 2006/0123919 A1* | 6/2006 | Lovell | ................... | G01L 5/0047 73/788 |
| 2010/0032806 A1 | 2/2010 | Kihara et al. | | |
| 2012/0283865 A1* | 11/2012 | Bailey, III | ............. | G01B 21/20 700/112 |
| 2013/0105759 A1* | 5/2013 | Cheng | ................. | H01L 45/1608 257/5 |
| 2014/0186977 A1 | 7/2014 | Yokokawa et al. | | |
| 2015/0279887 A1* | 10/2015 | Uematsu | ............. | H01L 27/1462 257/432 |
| 2016/0186362 A1* | 6/2016 | Mollart | ............. | H01L 21/02428 257/618 |
| 2017/0186977 A1* | 6/2017 | Dyatkin | ............. | H01L 51/0071 |

FOREIGN PATENT DOCUMENTS

| | | |
|---|---|---|
| JP | 09-008124 | 1/1997 |
| JP | 09-266206 | 10/1997 |
| JP | 2008-140856 | 6/2008 |
| JP | 2010-034461 | 2/2010 |
| JP | 2013-077652 | 4/2013 |

OTHER PUBLICATIONS

International Preliminary Report on Patentability for International Patent Application No. PCT/JP2018/021720, dated Jan. 14, 2020.
Written Opinion of the International Searching Authority for International Patent Application No. PCT/JP2018/021720, dated Aug. 21, 2018.

* cited by examiner

SILICON WAFER MANUFACTURING METHOD

TECHNICAL FIELD

The present invention relates to a method for manufacturing a silicon wafer serving as a substrate material for a semiconductor device and, more particularly, to a method for manufacturing a silicon wafer suitably used as a substrate material of a highly laminated semiconductor device such as a three-dimensional NAND flash memory (hereinafter, referred to as "3DNAND").

BACKGROUND ART

A 3DNAND is recently attracting attention. The 3DNAND is a NAND memory formed by vertically stacking memory cell arrays and, by setting the number of layers (number of layers of a word line) to 64, a storage capacity as very large as 512 Gbit (64 GB) per single die can be achieved. Further, not by increasing density in a planar direction as in a conventional planar type NAND memory, but by increasing density in a height direction, it is possible to provide a high performance flash memory which is excellent not only in capacity, but also in writing speed and power saving.

In the manufacture of a semiconductor device, films of various materials such as an oxide film, a nitride film, and a metal film are laminated on a silicon wafer so as to form a device structure. These laminated films have different film stresses depending on a film property and formation process conditions, which may produce a warp in the silicon wafer. Particularly, the 3DNAND is formed by vertically stacking several tens or more of memory elements, so that, correspondingly the number of laminated films increases geometrically, with the result that the film stress enormously increases in proportion to the increase in the number of the laminated films, and this significantly increases the warpage of the silicon wafer. A large warp of the silicon wafer during a device process causes troubles that prevent processing in the subsequent processes, such as film formation, processing and inspection from being performed properly.

Regarding the manufacture of a semiconductor device having three or more wiring layers, Patent Document 1, for example, describes a semiconductor device manufacturing method capable of reducing the warpage of a silicon substrate to equal to or less than a predetermined value without depending on the type of a fabrication apparatus to be used and without using a special interlayer film forming process. In this manufacturing method, assuming that the thickness of a silicon substrate is T (μm), the diameter thereof is D (inch), and the number of wiring layers is n, a silicon substrate satisfying $T \geq 62.4 \times D \times [1.6(n-1)+1.0]^{1/2}$ is used to manufacture a semiconductor device.

Further, Patent Documents 2 and 3 describe a method of manufacturing an epitaxial silicon wafer having high flatness by forming an epitaxial layer on the surface of a silicon wafer for epitaxial growth having a bowl-shaped warp (having a concave at the center thereof).

BACKGROUND ART LITERATURE

Patent Document

Patent Document 1: Japanese Patent Application Laid-Open No. H09-266206

Patent Document 2: Japanese Patent Application Laid-Open No. 2008-140856

Patent Document 3: Japanese Patent Application Laid-Open No. 2010-034461

SUMMARY OF THE INVENTION

Problems to be Solved by the Invention

However, the semiconductor device manufacturing method described in Patent Document 1 assumes that the film stress of the wiring layer is not varied, and the formation process dependency of the film stress is ignored. Actually, the film stress varies dependent on the formation process conditions, so that the amount of warpage cannot be evaluated only from the number of wiring layers. Thus, it is difficult to apply this manufacturing method. Further, when the number of wiring layers is set to 500 in a 12-inch silicon wafer, it is enough, according to the above formula, to satisfy the thickness T of the silicon wafer≥777.1 μm, which, however, is substantially equal to the standard thickness (775 μm) of the 12-inch wafer and, thus, it is clear that the effect of suppressing the warping cannot be expected.

The specifications (thickness, etc.) of a silicon wafer are previously specified irrespective of the amount or shape of the warp. Thus, even when warpage occurs in the silicon wafer during a device process, it is impossible to cope with the warping of the wafer due to absence of the criterion for specification change of the silicon wafer.

The larger the thickness of a silicon wafer, the more unlikely the silicon wafer is warped, so that it can be thought that a silicon wafer having a very large thickness in which warpage hardly occurs under any conditions is used. However, the larger the thickness of a silicon wafer, the smaller the number of wafers that can be obtained from one silicon single crystal ingot, which will not only deteriorate product yield but also cause various problems in the subsequent processes, such as deterioration in handleability due to an increase in wafer weight. Therefore, it is desired to provide a silicon wafer having a thickness as small as possible while reducing the amount of warpage to some extent.

The object of the present invention is therefore to provide a silicon wafer capable of reducing the warp of the wafer occurring during a manufacturing process of a semiconductor device such as a 3DNAND and allowing the subsequent processes, which could suffer from problems due to a large warp of the wafer, to be carried out without problems, and manufacturing method therefor.

Means for Solving the Problems

To solve the above problems, a silicon wafer manufacturing method according to the present invention includes calculating a target thickness of a silicon wafer required for ensuring a warpage reduction amount of the silicon wafer warped during a device process from a relationship between an amount of warpage of a silicon wafer and a thickness of the silicon wafer occurring due to application of the same film stress to a plurality of silicon wafers having mutually different thicknesses, and processing a silicon single crystal ingot to thereby manufacture silicon wafers having the target thickness.

According to the present invention, how much the silicon wafer is warped with what thickness of the silicon wafer applied with an identical film stress can be grasped, whereby it is possible to grasp how much the amount of warpage is reduced when how much the thickness of the wafer is increased. Therefore, the warpage reduction amount of the wafer set beforehand considering the warpage of the wafer occurring during a device process can be actually ensured, allowing the subsequent processes, which have been suffered from problems due to a large warp of the wafer, to be carried out without problems.

The amount of warpage of the wafer differs depending on the type (tensile stress or compressive stress) of the film stress or actual process conditions and thus cannot be calculated simply from the number of wiring layers. The target warpage reduction amount of the wafer differs depending on the actual warpage amount of the wafer during a device process and the allowable range of the wafer warpage amount in each process. Further, it is not practical to use a wafer having a very large thickness in order to suppress wafer warpage, and it is impossible to completely suppress wafer warpage only by controlling the wafer thickness. Various countermeasures against warping are required to sufficiently reduce the wafer warpage, and the wafer thickness control is merely one of the countermeasures against warping. Thus, it is sufficient to reduce the warpage by, e.g., 10% by the wafer thickness control, and the present invention is effective as a method for solving the problem of the wafer warpage in the device process.

Preferably, the silicon wafer manufacturing method according to the present invention calculates a relational formula between the warpage reduction amount of the silicon wafer warped during a device process and the target thickness of the silicon wafer from the relationship between the amount of warpage of the silicon wafer and the thickness thereof, and calculates the target thickness of the silicon wafer by substituting the warpage reduction amount into the relational formula. This allows the wafer target thickness required for ensuring the warpage reduction amount of the silicon wafer to be easily calculated.

In the silicon wafer manufacturing method according to the present invention, the relational formula preferably satisfies $y=A(x/t-1)$, where y is the warpage reduction amount of the silicon wafer, x is the target thickness of the silicon wafer, t is a standard thickness of the silicon wafer, and A is a constant. In this case, the relationship between the amount of warpage of the silicon wafer and the thickness thereof preferably includes the relationship between the amount of warpage of a silicon wafer having the standard thickness t and the standard thickness t. This allows the wafer target thickness required for ensuring the warpage reduction amount y of the silicon wafer corresponding to the standard thickness of the silicon wafer to be easily calculated.

In the present invention, the constant A is preferably a value according to the amount of warpage of the silicon wafer occurring due to a device process. This allows the wafer target thickness required for ensuring the warpage reduction amount y of the silicon wafer to be accurately calculated.

In the silicon wafer manufacturing method according to the present invention, when the shape of the warp of the silicon wafer occurring due to a difference in the stress component of the films laminated during device formation is a bowl shape, the constant A is preferably equal to or less than 900. This allows a wafer target thickness suitable for reducing the bowl-shaped warp of the wafer.

In the silicon wafer manufacturing method according to the present invention, when the shape of the warp of the silicon wafer occurring due to a difference in the stress component of the films laminated during device formation is a saddle shape, the constant A is preferably equal to or less than 1500. This allows a wafer target thickness suitable for reducing the saddle-shaped warp of the wafer to be obtained.

In the present invention, the device is preferably a 3DNAND flash memory. As described above, in the 3DNAND flash memory, the stacking number of memory cell arrays is very large, so that the problem of the wafer warpage is conspicuous. That is, when the number of layers increases along with advance of a device process, the wafer warpage also increases, and the amount of warpage exceeds an allowable range before reaching the topmost layer, which may make it impossible to advance the device process further. However, according to the present invention, countermeasures against warping are taken in a wafer state before device formation, so that the problem of the warping can be solved, thus avoiding the situation where it is impossible to advance the device process further.

Effects of the Invention

According to the present invention, there can be provided a silicon wafer manufacturing method capable of reducing the warpage of the wafer occurring during a device process and allowing the subsequent processes, which have been suffered from problems due to a large warp of the wafer, to be carried out without problems.

DETAILED DESCRIPTION OF THE EMBODIMENTS

Hereinafter, preferred embodiments of the present invention will be described in detail with reference to the accompanying drawings.

Figure 1:
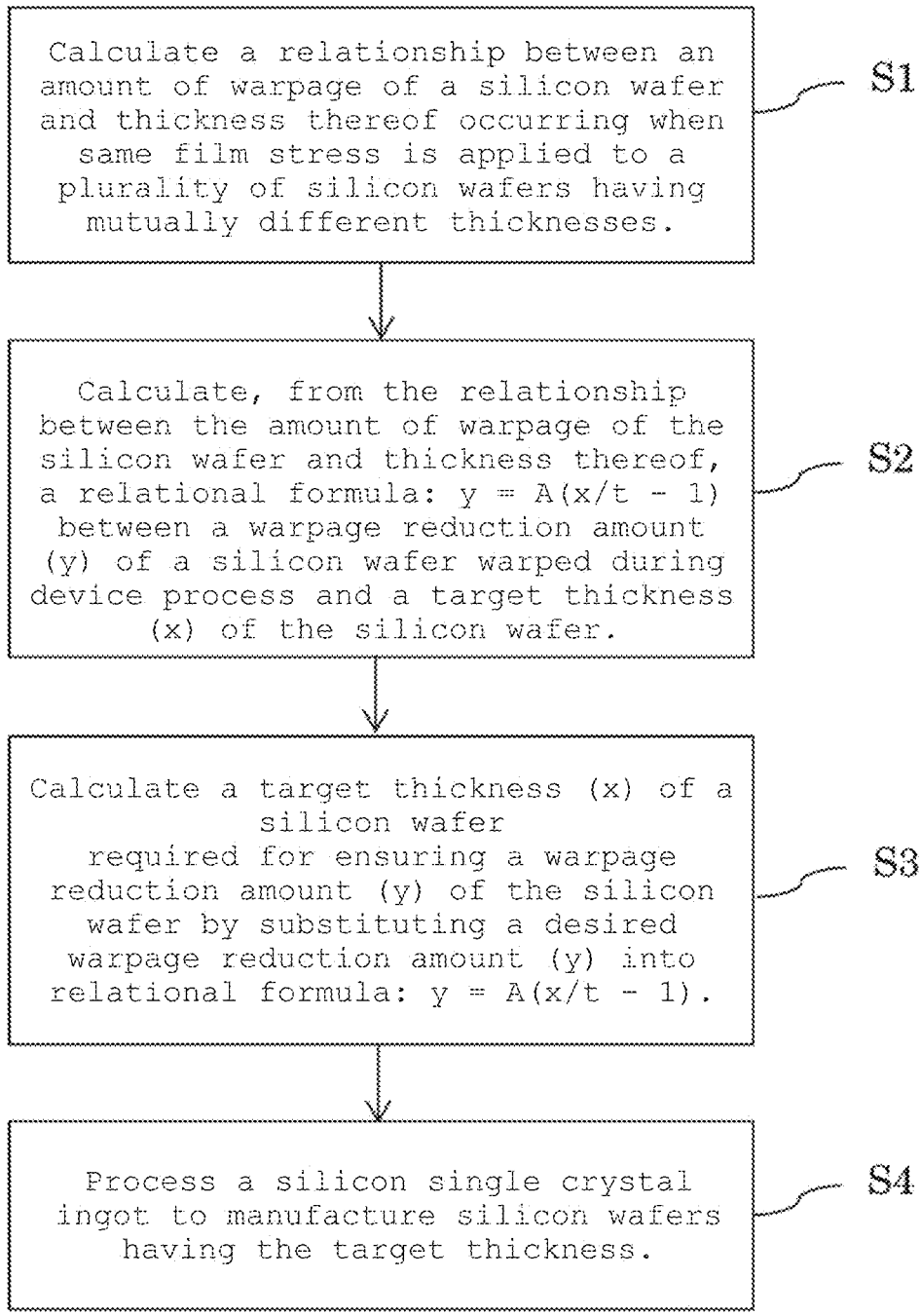
FIG. 1 is a flowchart for explaining a silicon wafer manufacturing method according to an embodiment of the present invention.

FIG. 1 is a flowchart for explaining a silicon wafer manufacturing method according to an embodiment of the present invention.

As illustrated in FIG. 1, the silicon wafer manufacturing method according to the present embodiment includes: a first step S1 of calculating a relationship between an amount of warpage of a silicon wafer and a thickness thereof occurring when the same film stress is applied to a plurality of silicon wafers having mutually different thicknesses; a second step S2 of calculating, from the relationship between the amount of warpage of the silicon wafer and the thickness thereof, a relational formula between a warpage reduction amount (y) of a silicon wafer warped during a device process and a target thickness (x) of the silicon wafer; a third step S3 of calculating a target thickness (x) of a silicon wafer required for ensuring a warpage reduction amount (y) of the silicon wafer by substituting a desired warpage reduction amount (y) into the relational formula; and a fourth step S4 of processing a silicon single crystal ingot to manufacture silicon wafers having the target thickness.

The silicon wafer in the present embodiment refers to a silicon wafer before being subjected to device processing and is a wide concept including not only a general silicon wafer (polished wafer), but also an epitaxial wafer, an anneal wafer, an SOI wafer and the like. The amount of warpage (Warp) of the silicon wafer can be defined as the difference between maximum and minimum values of an error between a reference surface and a measurement surface.

In the present embodiment, a data table showing the relationship between the amount of warpage of the silicon wafer and the thickness thereof includes data indicating the relationship between the amount of warpage of a silicon wafer having a standard thickness and the standard thickness. The standard thickness of the silicon wafer refers to a thickness set based on the diameter of the silicon wafer. For example, the standard thickness of a silicon wafer having a diameter of 300 mm is 775 µm. Thus, since the data indicating the relationship between the amount of warpage of the silicon wafer and the thickness thereof includes the amount of warpage corresponding to the standard thickness of the silicon wafer, reliability of the relational formula between the warpage reduction amount and the target thickness of the silicon wafer can be enhanced to thereby make it possible to accurately and easily calculate the target thickness of the wafer required for ensuring the warpage reduction amount of the silicon wafer.

The relational formula between the silicon wafer warpage reduction amount (y) and the silicon wafer target thickness (x) can be calculated from the relationship between the silicon wafer warpage amount and the silicon wafer thickness. The relationship between the silicon wafer warpage amount and the silicon wafer thickness is represented by a linear function, and the larger the wafer thickness is, the smaller the amount of warpage becomes. The change rate (slope) of the amount of warpage with respect to the wafer thickness slightly varies depending on the magnitude of the film stress applied to the silicon wafer, but does not vary significantly. The present invention has been made in view of this point and is very effective as an index for reducing the silicon wafer warpage amount.

After thus calculating the silicon wafer target thickness, silicon wafers having the calculated target thickness are manufactured. In general, the silicon wafers are manufactured by sequentially applying peripheral grinding, slicing, lapping, etching, double-side polishing, single-side polishing, washing and the like to a silicon single crystal ingot grown by a CZ method. At this time, the slicing conditions or lapping conditions are controlled such that the final thickness of the wafers becomes the target thickness. The thus manufactured silicon wafers are then conveyed to a manufacturing process for a semiconductor device such as a 3DNAND, to become a substrate material for a semiconductor device.

As described above, in the semiconductor device manufacturing process, films of various materials such as an oxide film, a nitride film, and a metal film are laminated on a silicon wafer so as to form a device structure on the silicon wafer. These laminated films have different film stresses according to film properties and formation process conditions, which may produce a warp in the silicon wafer depending on the stress of the laminated films. Particularly, the 3DNAND is formed by vertically stacking several tens or more of memory elements, so that, correspondingly the number of laminated films is increased geometrically, with the result that the film stress enormously increases in proportion to the increase in the number of the laminated films, resulting in a significant increase in the silicon wafer warpage.

On the other hand, in the present invention, by theoretically controlling the initial shape of the silicon wafer, warpage occurring during a device process can be reduced, making it possible to carry out the subsequent processes without problems. That is, by providing a silicon wafer having an adequate thickness based on the amount of warpage actually occurring during the semiconductor device process, the amount of warpage can be reduced. Further, it is possible to reduce or prevent defects such as dislocation caused due to the warping of the silicon wafer.

Figure 2:
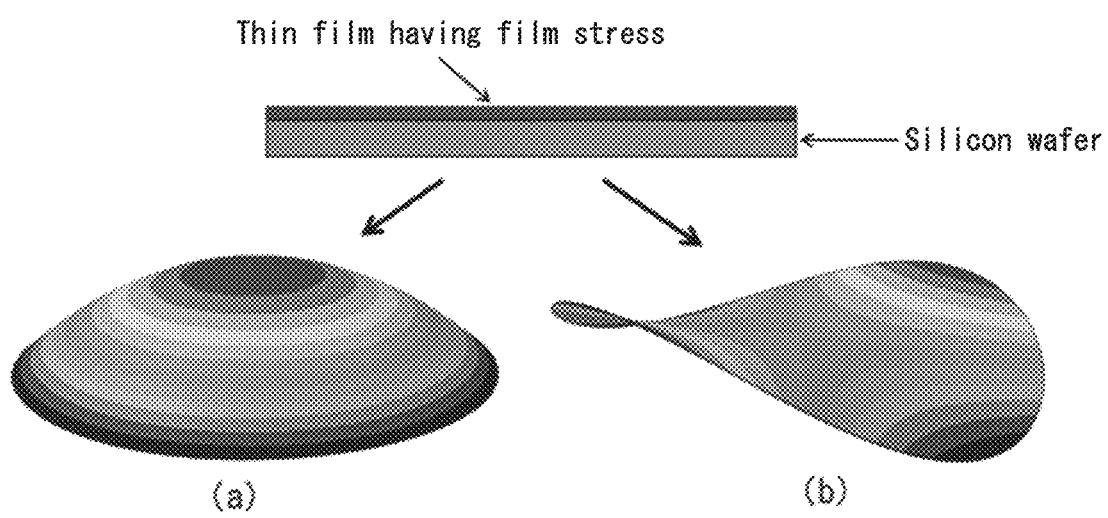
FIG. 2 is a schematic view for explaining a difference in how the wafer is warped due to a film stress applied to the silicon wafer.

FIG. 2 is a schematic view for explaining a difference in how the wafer is warped due to the film stress applied to the silicon wafer.

As illustrated in FIG. 2, when a laminated film such as a wiring layer constituting a semiconductor device is formed on a silicon wafer, a film stress is generated in the silicon wafer, whereby a bowl-shaped warp as illustrated in (a) or a saddle-shaped warp as illustrated in (b) is generated. When such warpage of the wafer becomes severe, various problems arise in the subsequent processes.

The amount of warpage of the silicon wafer on the surface of which a thin film having a film stress is formed varies according to the thickness of the silicon wafer. In particular, with respect to the same film stress, the larger the wafer thickness is, the smaller the amount of warpage becomes. This can also be seen from the Stoney Equation $\sigma_f t_f = E_s h^2/6R$ which is the commonly known relational formula between the film stress and the wafer warp. In the above Stoney Equation, $\sigma_f$ is a film stress, $t_f$ is a film thickness, Es is the Young's modulus of the substrate, h is a substrate thickness, and R is a warp radius.

Figure 3:
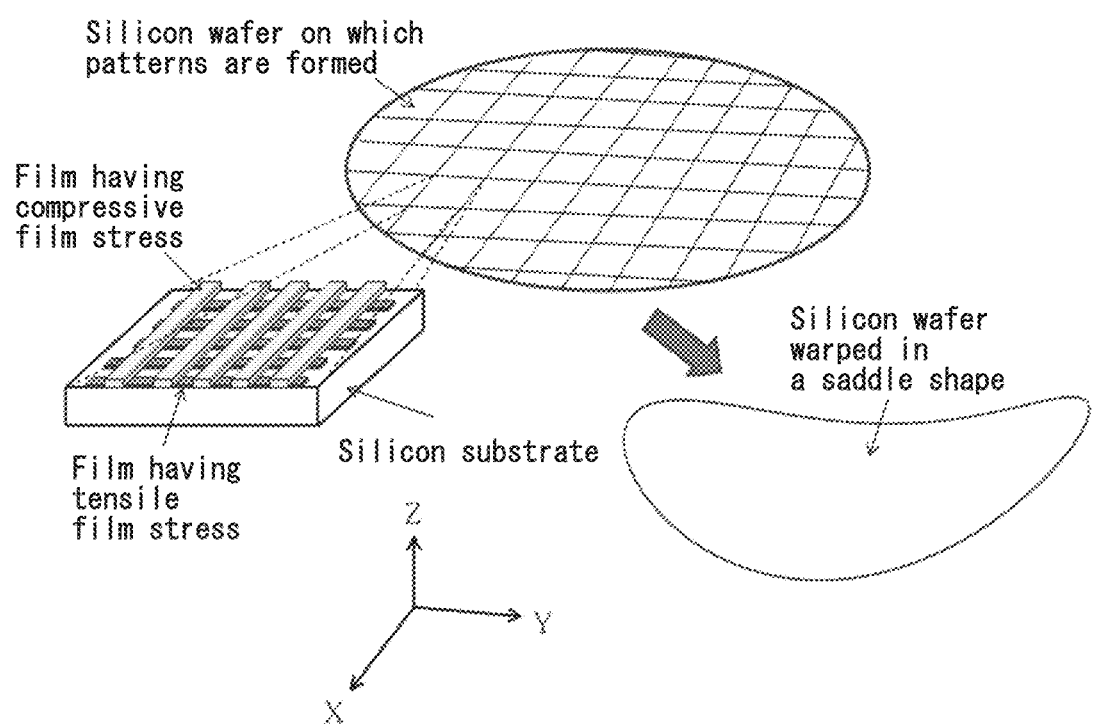
FIG. 3 is a schematic view for explaining a film pattern on a silicon wafer warped in a saddle shape.

The reason that the silicon wafer is warped into a saddle shape as illustrated in FIG. 2B during a device process is that the signs of the film stresses of the films formed on the silicon wafer differ from each other to generate anisotropy of the film stress. For example, as illustrated in FIG. 3, when, in addition to a wiring layer in which a compressive stress in the X-direction is dominant, a wiring layer having a tensile stress in the Y-direction perpendicular to the X-direction is formed, the compressive stress in the X-direction is emphasized, with the result that the silicon wafer is warped in a saddle shape.

The Young's modulus of a silicon crystal varies depending on a crystal orientation, that is, it has orientation dependency. Specifically, the Young's modulus of a silicon crystal is 130 MPa in [100] direction, 170 MPa in [110] direction, and 189 MPa in [111] direction. The smaller the Young's modulus is, the easier deformation occurs. When the wafer is warped in a saddle shape, coincidence between the warp direction of the wafer and the direction of a crystal orientation in which Young's modulus is small makes the wafer more likely to be warped to increase the amount of warpage. Conversely, coincidence between the warping direction of the wafer and the direction of a crystal orientation in which Young's modulus is large makes the wafer more unlikely to be warped to reduce the amount of warpage.

The warpage of the wafer occurring when a thin film having a film stress is formed on a silicon wafer can be reproduced by simulation. By calculating the thickness dependency of the silicon wafer with respect to the same film stress by simulation according to a finite element method, the relational formula between the thickness of a silicon wafer and the amount of warpage thereof can be calculated.

The relationship between the amount of warpage of a silicon wafer occurring in device formation involving film lamination and the thickness thereof is thus calculated, and the thickness x of the silicon wafer and the warpage reduction amount y are formulated by the relational formula: $y=A(x/t-1)$. In this formula, t is the standard thickness (μm) of the silicon wafer, and, for example, the standard thickness of a silicon wafer having a diameter of 300 mm is 775 μm. The formula is formed for both the bowl shape and saddle shape of the warping (see FIG. 2) occurring due to the difference in the stress component of the films laminated during device formation. Then, the thickness of the wafer according to the warpage reduction amount desired to be obtained in the device process is derived from the relational formula between the thickness of the silicon wafer and the warpage reduction amount. Then, silicon wafers having the thus derived thickness are manufactured. The silicon wafers are manufactured by processing a silicon single crystal ingot.

The constant A in the relational formula between the thickness of the silicon wafer and the warpage reduction amount is preferably set to a value according to the amount of warpage of the wafer occurring due to a device process. In this case, when the silicon wafer is warped in a bowl shape, the constant A is preferably equal to or less than 900. Further, when the silicon wafer is warped in a saddle shape, the constant A is preferably equal to or less than 1500.

As described above, according to the silicon wafer manufacturing method of the present embodiment, in a silicon wafer on the surface of which a semiconductor device is formed, the warpage amount of the silicon wafer occurring due to the film stress of the laminated film such as a wiring layer formed on the silicon wafer can be reduced to equal to or less than a predetermined value.

While the present invention has been described based on the preferred embodiment, the present invention is not limited to the above embodiment, and various modifications may be made within the scope of the present invention. Accordingly, all such modifications are included in the present invention.

For example, although the silicon wafer manufacturing method suitable for manufacture of a 3DNAND has been described in the above embodiment, the present invention is not limited to this and may be applied to silicon wafers for various semiconductor devices in which the wafer may be warped due to the film stress.

EXAMPLES

Example 1

As a result of forming a silicon oxide film of 2 μm thickness on a silicon wafer having a diameter of 300 mm and a thickness of 775 μm by a CVD (Chemical Vapor Deposition) process, a convex bowl-shaped warp occurred toward the film formation surface of the wafer. The amount of warpage (Warp) of the wafer was measured using a wafer flatness/shape measuring device to be 610 μm (standard warpage amount).

The silicon oxide film was formed in the similar manner on silicon wafers having thicknesses of 800 μm, 825 μm and 850 μm, and the amounts of warpage of the respective wafers were measured to be 585 μm, 560 μm and 535 μm.

Figure 4:
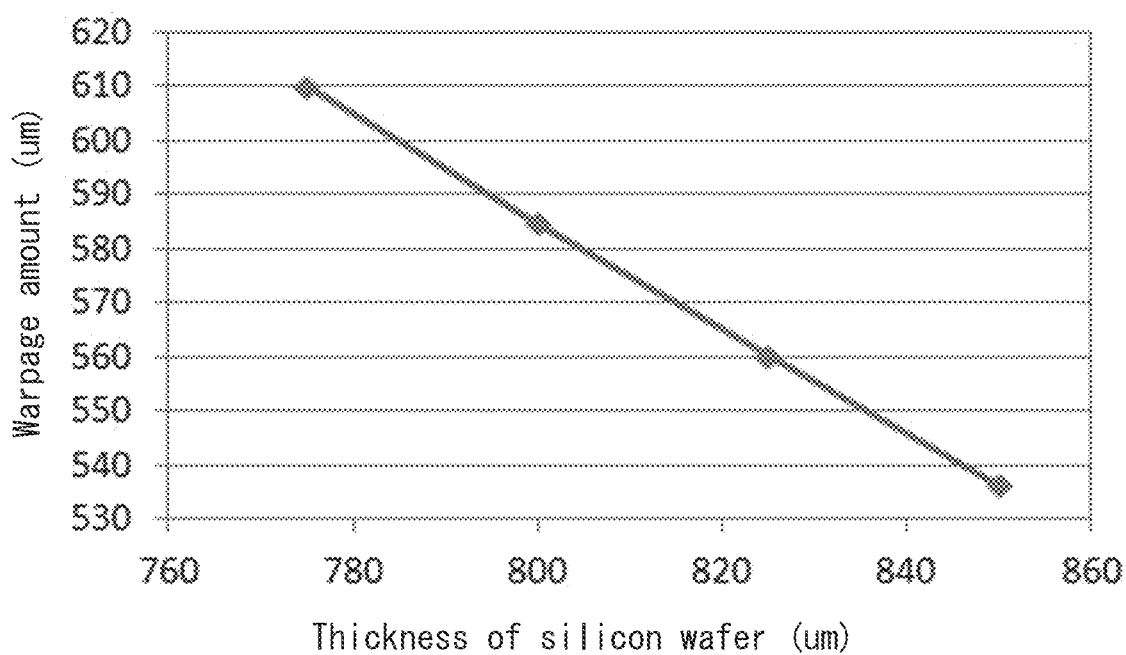
FIG. 4 is a graph illustrating the relationship between the thickness of a silicon wafer warped in a bowl shape and a warpage amount thereof.

FIG. 4 is a graph illustrating the relationship between the thickness of a silicon wafer and the amount of warpage thereof. The horizontal axis represents the thickness of the silicon wafer, and the vertical axis represents the amount of warpage thereof. As can be seen from FIG. 4, when the film stress is constant, the larger the thickness of the silicon wafer, the smaller the amount of warpage becomes.

Figure 5:
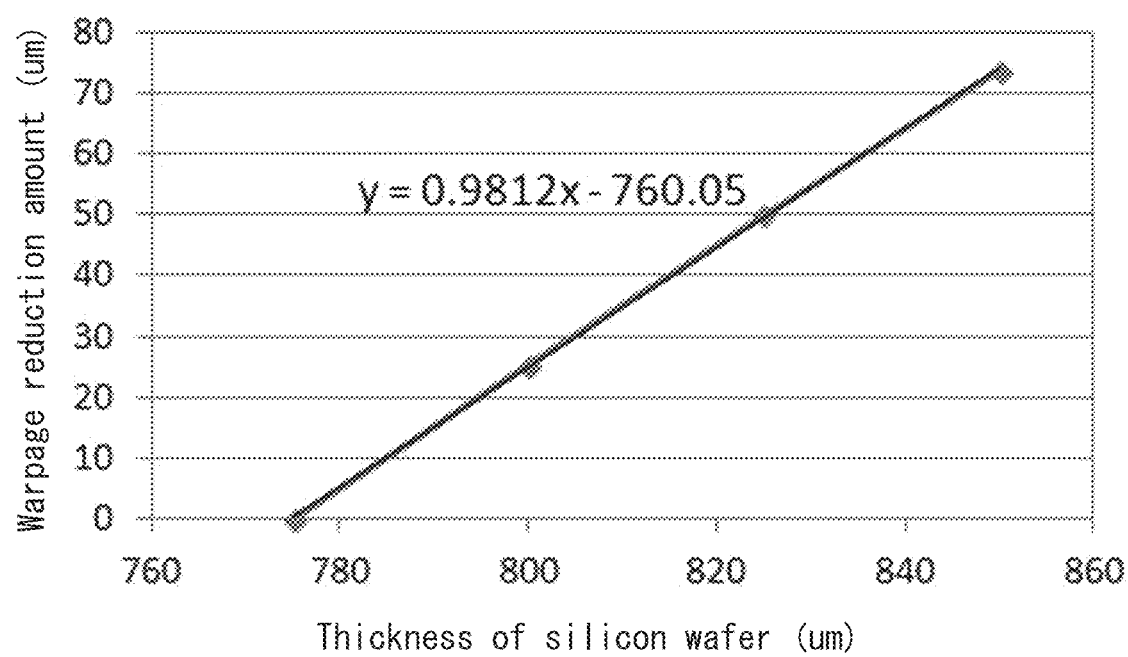
FIG. 5 is a graph illustrating the relationship between the thickness of a silicon wafer and a warpage reduction amount which is obtained by converting the graph of FIG. 4.

FIG. 5 is a graph illustrating the relationship between the thickness of a silicon wafer and the warpage reduction amount which is obtained by converting the graph of FIG. 4. The horizontal axis represents the thickness of the silicon wafer, and the vertical axis represents the warpage reduction amount. The graph of FIG. 5 indicates how much the amount of warpage is reduced when how much the wafer thickness is increased with the amount of warpage of the silicon wafer having the standard thickness (775 μm) set as a reference (zero). When the graph of FIG. 5 is represented by the relational formula between the target thickness x of the silicon wafer and the warpage reduction amount y: $y=A(x/775-1)$, the following formula is obtained.

$$y=760.5(x/775-1) \qquad \text{(formula 1)}$$

The above relational formula means that when a target warpage reduction amount is substituted into y, the wafer thickness x required for improving the amount of warpage can be calculated.

Then, a confirmation experiment was performed using the above relational formula. When the target warpage reduction amount y=35 μm is substituted into the relational formula: $y=760.5(x/775-1)$, the target thickness x of the silicon wafer=810.67 μm is obtained. Then, when a silicon wafer having a diameter of 300 mm and a thickness of 810.2 μm was prepared, and a silicon oxide film having a thickness of 2 μm was formed thereon by the CVD process, a convex bowl-shaped warp occurred in the wafer. The amount of warpage was 572.2 μm. The actual warpage reduction amount was 610−572.2=37.8 μm. Since the target warpage reduction amount is y=35 μm, the obtained result nearly complies with the target value.

Example 2

In addition to Example 1, two silicon wafers each having a diameter of 300 mm and a thickness of 775 μm were prepared, and a silicon oxide film having a thickness of 0.8 μm was formed on one silicon wafer by the CVD process. As a result, a convex bowl-shaped warp occurred in the wafer. The amount of warpage was 233 μm. On the other hand, when a silicon oxide film having a thickness of 3.5 μm was formed on the other silicon wafer in the same manner, a convex bowl-shaped warp occurred in the wafer. The amount of warpage was 1042 μm.

The silicon oxide film was formed in a similar manner on silicon wafers having thicknesses of 800 μm, 825 μm and 850 μm. After that, the amounts of warpage of the respective wafers were measured, and the relationship between the thickness of the silicon wafer and the amount of warpage was calculated. Then, the warpage reduction amount of the wafer was calculated by converting the relationship into a relative value compared to the amount of warpage of the silicon wafer having the standard thickness (775 μm). The result is illustrated in the graph of FIG. 6.

Figure 6:
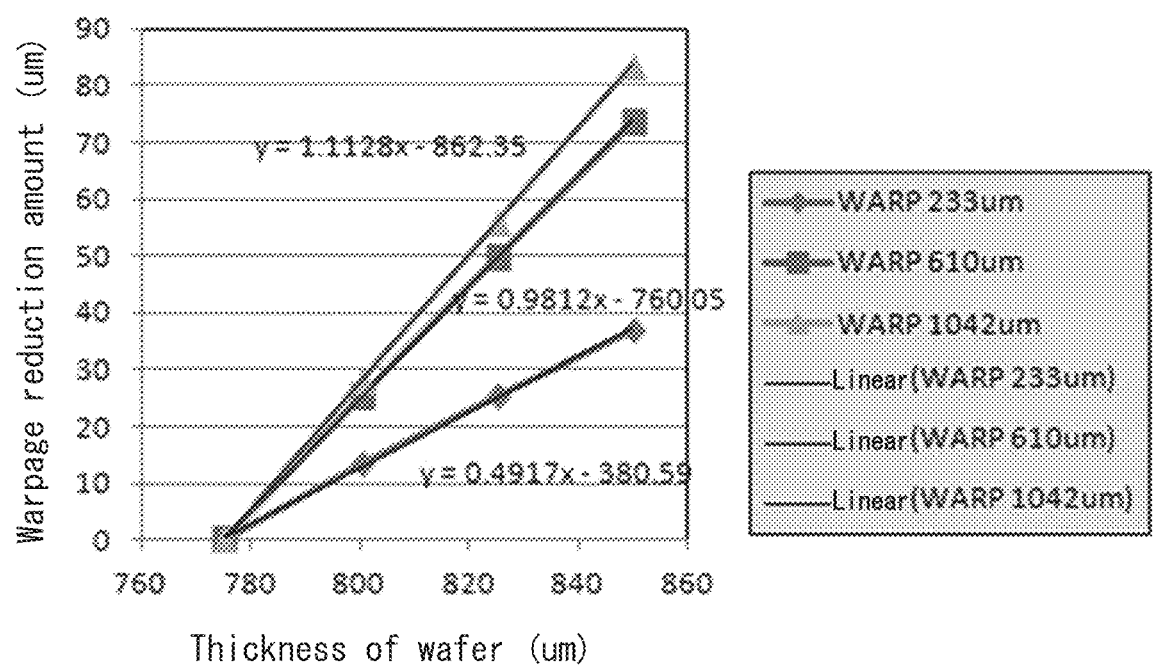
FIG. 6 is a graph illustrating the wafer thickness and warpage reduction amount in the same manner as in FIG. 5.

FIG. 6 is a graph illustrating the wafer thickness and the warpage reduction amount in the same manner as in FIG. 5 with the horizontal axis as the thickness of the wafer and the vertical axis as the warpage reduction amount of the wafer. As illustrated in FIG. 6, the slopes of the straight lines in the graph slightly differ from one another, and the larger the film stress to be applied to the wafer is, the larger the slope becomes.

Figure 7:
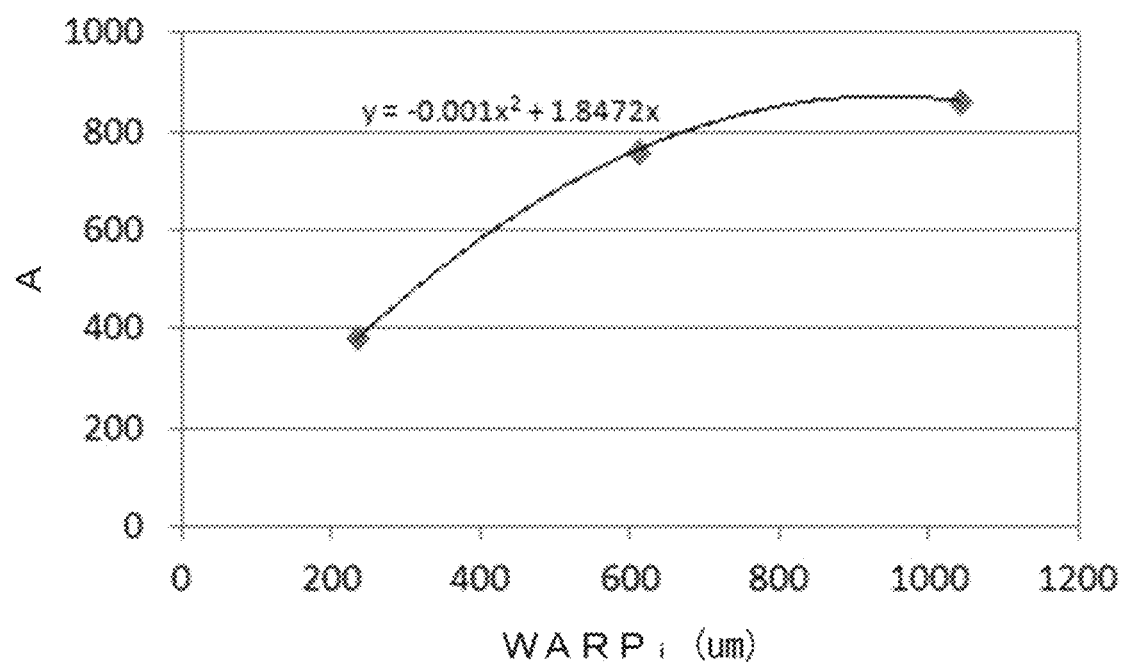
FIG. 7 is a graph illustrating the relationship between a constant A and a reference warpage amount $WARP_i$.

The graph of FIG. 6 is represented by the relational formula between the target thickness (x) of the silicon wafer and the warpage reduction amount (y): $y=A(x/775-1)$, and the constant A is set to a function of a reference warpage amount $WARP_i$ as illustrated in FIG. 7. As a result, the following formula is obtained.

$$A=-0.001 \times WARP_i^2+1.8472 \times WARP_i \quad \text{(formula 2)}$$

The reference warpage amount $WARP_i$ refers to the amount of warpage when the wafer has the standard thickness (775 μm), and the reference warpage amounts $WARP_i$ when the thicknesses of the silicon oxide films are 0.8 μm, 2 μm, and 3.5 μm are 233 μm, 610 μm and 1042 μm, respectively. As is clear from FIG. 7, the constant A is not proportional to the increase in the reference warpage amount $WARP_i$ but is saturated, and when the silicon wafer is warped in a bowl shape, the constant A is equal to or less than 900.

From the relational formula between the constant A and the reference warpage amount $WARP_i$, the constant A when the reference warpage amount $WARP_i$ is 233 μm becomes 380.59. Thus, the relational formula between the thickness x of the silicon wafer and the warpage reduction amount y is $y=380.59(x/775-1)$.

Then, a confirmation experiment was performed using the above relational formula. When the target warpage reduction amount y=20 μm is substituted into the relational formula: $y=380.59(x/775-1)$, the target thickness x of the silicon wafer=815.73 μm is obtained. Then, when a silicon wafer having a diameter of 300 mm and a thickness of 815.5 μm was prepared, and a silicon oxide film having a thickness of 0.8 μm was formed thereon by the CVD process, a convex bowl-shaped warp occurred in the wafer. The amount of warpage was 210.2 μm. The actual warpage reduction amount was 233−210.2=22.8 μm. Since the target warpage reduction amount is y=20 μm, the obtained result nearly complies with the target value.

Example 3

Figure 8:
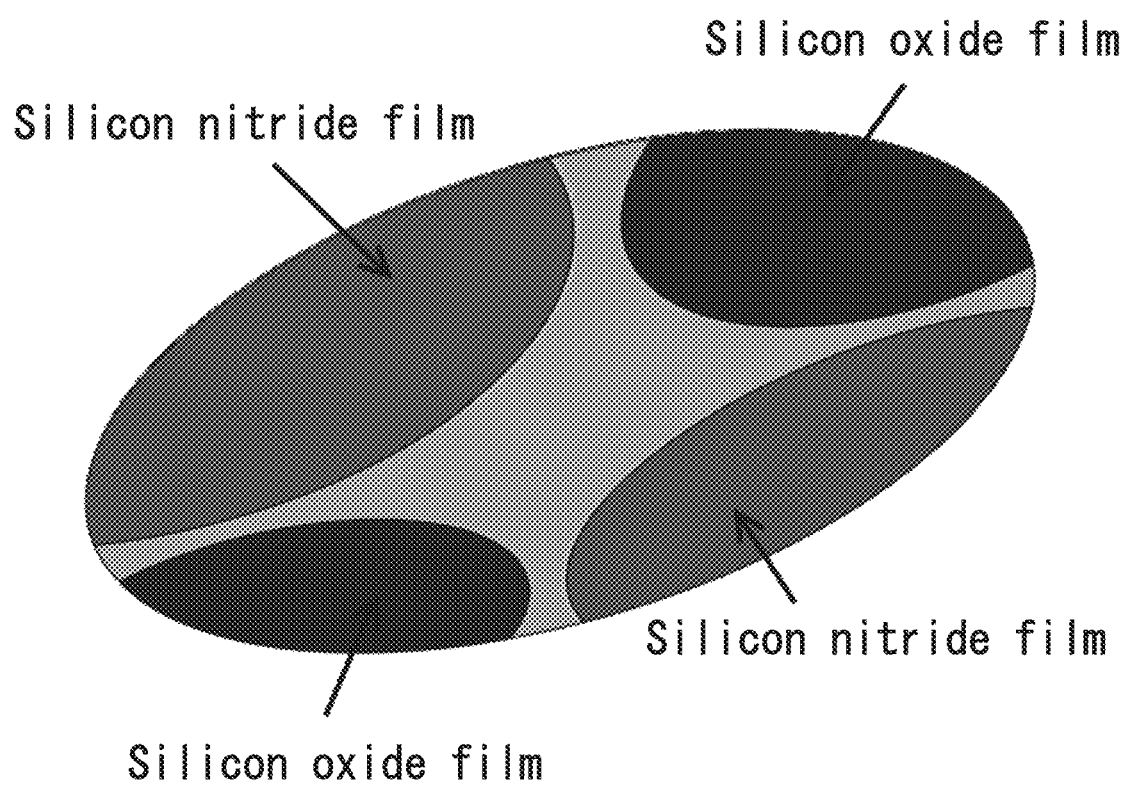
FIG. 8 is a schematic perspective view illustrating a film formation pattern on a silicon wafer.

A silicon oxide film having a thickness of 1 μm was formed, by the CVD process, on a (100) silicon wafer having a diameter of 300 mm and a thickness of 775 μm, followed by partial etching of the film using a mask, and then a silicon nitride film having a thickness of 0.7 μm was formed in a similar manner, followed by partial etching of the film using a mask, whereby a film formation pattern as illustrated in FIG. 8 was obtained. As a result, a saddle-shaped warp occurred in the wafer. The amount of warpage (Warp) of the wafer was measured to be 608 μm (standard warpage amount).

The film formation was performed in a similar manner for silicon wafers having thicknesses of 800 μm, 825 μm and 850 μm, and the amounts of warpage of the respective wafers were measured to be 575 μm, 545 μm and 515 μm.

Figure 9:
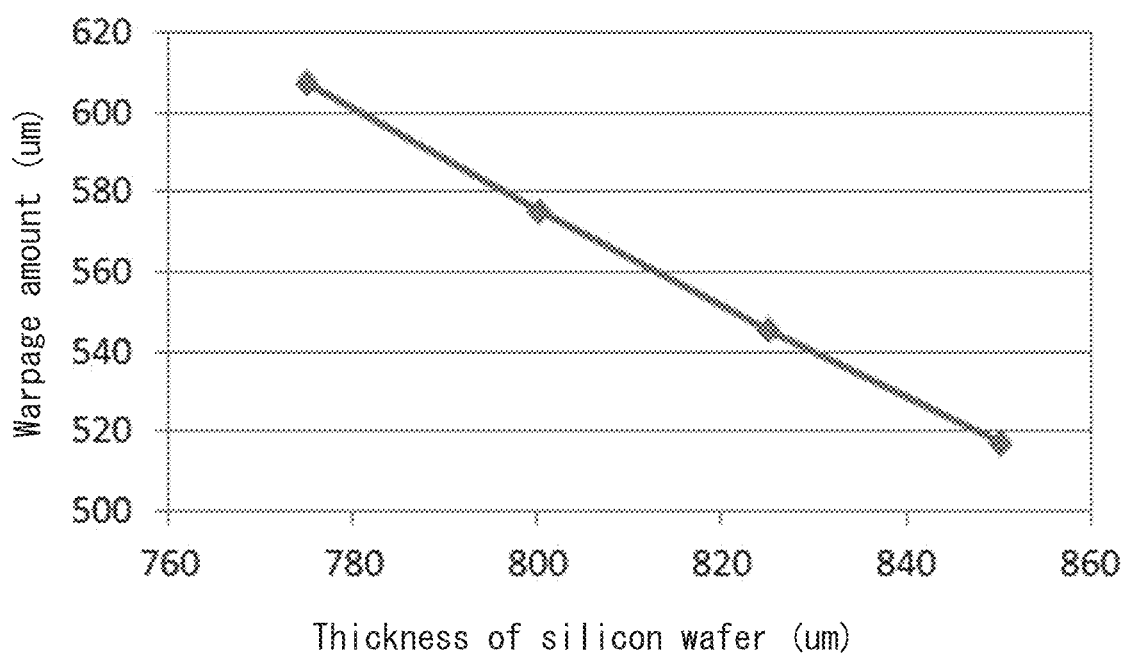
FIG. 9 is a graph illustrating the relationship between the thickness of a silicon wafer warped in a saddle shape and a warpage amount thereof.

FIG. 9 is a graph illustrating the relationship between the thickness of a silicon wafer and the warpage amount thereof. The horizontal axis represents the thickness of the silicon wafer, and the vertical axis represents the amount of warpage thereof. As can be seen from FIG. 9, when the film stress is constant, the larger the thickness of the silicon wafer, the smaller the amount of warpage becomes even in a case where the wafer is warped in a saddle shape.

Figure 10:
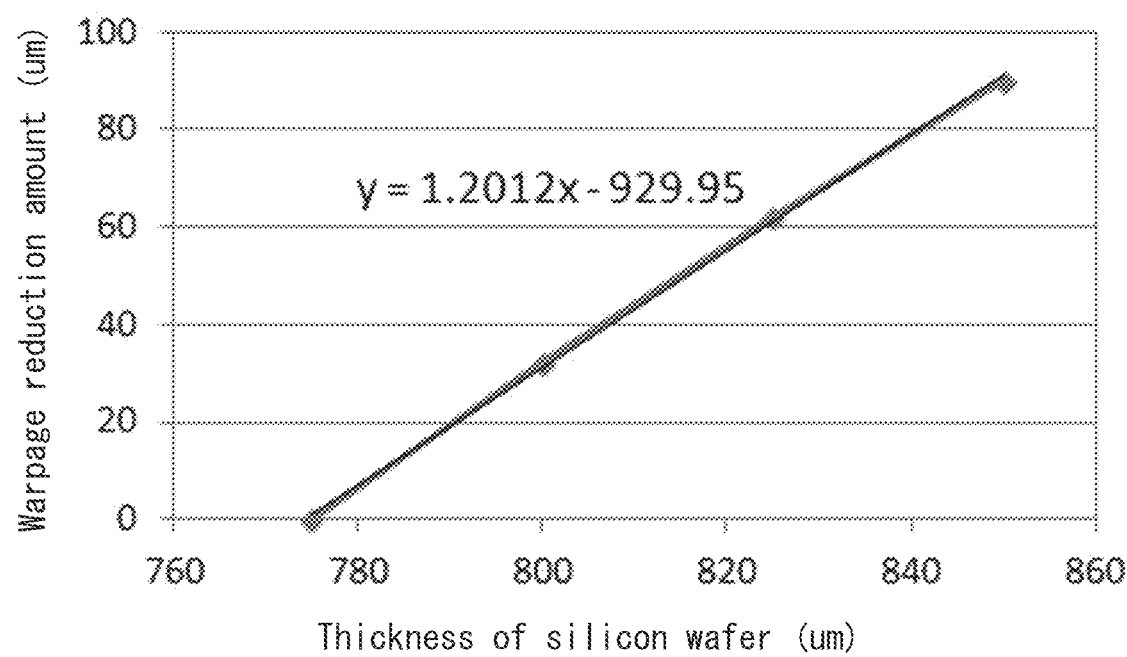
FIG. 10 is a graph illustrating the relationship between the thickness of a silicon wafer and a warpage reduction amount which is obtained by converting the graph of FIG. 9.

FIG. 10 is a graph illustrating the relationship between the thickness of a silicon wafer and warpage reduction amount which is obtained by converting the graph of FIG. 9. The horizontal axis represents the thickness of the silicon wafer, and the vertical axis represents the warpage reduction amount. The graph of FIG. 10 indicates how much the amount of warpage is reduced when how much the wafer thickness is further increased with the amount of warpage of the silicon wafer having the standard thickness (775 μm) set as a reference (zero). When the graph of FIG. 10 is represented by the relational formula between the target thickness x of the silicon wafer and the warpage reduction amount y: $y=A(x/775-1)$, the following formula is obtained.

$$y=925.95(x/775-1) \quad \text{(formula 3)}$$

Then, a confirmation experiment was performed using the above relational formula. When the target warpage reduction amount y=45 μm is substituted into the relational formula: $y=925.95(x/775-1)$, the target thickness x of the silicon wafer=812.7 μm is obtained. Then, when a silicon wafer having a diameter of 300 mm and a thickness of 812.1 μm was prepared, and a silicon oxide film having a thickness of 2 μm was formed thereon by the CVD process, a convex bowl-shaped warp occurred in the wafer. The amount of warpage was 565.0 μm. The actual warpage reduction amount was 608−565.0=43 μm. Since the target warpage reduction amount is y=45 μm, the obtained result nearly complies with the target value.

Example 4

In addition to Example 3, two wafer-shaped (100) silicon wafers each having a diameter of 300 mm and a thickness of 775 μm were prepared, and silicon oxide films having thicknesses of 0.5 μm and 2.0 μm were formed on the two silicon wafers, respectively, by the CVD process, followed by partial etching using a mask, and then silicon nitride films having thicknesses of 0.24 μm and 1.4 μm were formed thereon, respectively, by the CVD process, followed by partial etching using a mask, whereby respective film formation patterns as illustrated in FIG. 8 were formed. As a result, saddle-shaped warps occurred in the respective wafers. The amounts of warpage were respectively 213 μm and 1217 μm.

The film formation was performed in a similar manner for silicon wafers having thicknesses of 800 μm, 825 μm and 850 μm. After that, the amounts of warpage of the respective wafers were measured, and the relationship between the thickness of the silicon wafer and the warpage amount was calculated. Then, the warpage reduction amount of the wafer was calculated by converting the relationship into a relative value compared to the amount of warpage of the silicon wafer having the standard thickness (775 μm). The result is illustrated in FIG. 11.

Figure 11:
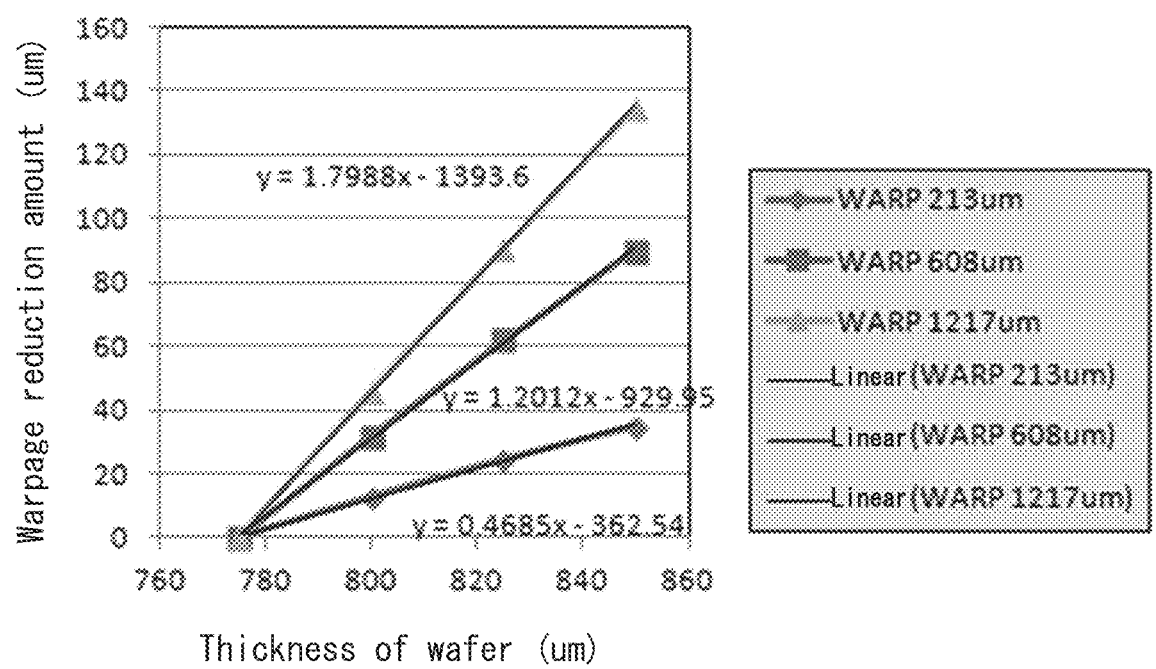
FIG. 11 is a graph illustrating the wafer thickness and a warpage reduction amount in the same manner as in FIG. 10.

FIG. 11 is a graph illustrating the relationship between the wafer thickness and the warpage reduction amount in the same manner as in FIG. 10 with the horizontal axis as the thickness of the wafer and the vertical axis as the warpage reduction amount of the wafer. As illustrated in FIG. 11, the slopes of the straight lines in the graph slightly differ from one another, and the larger the film stress to be applied to the wafer is, the larger the slope becomes.

Figure 12:
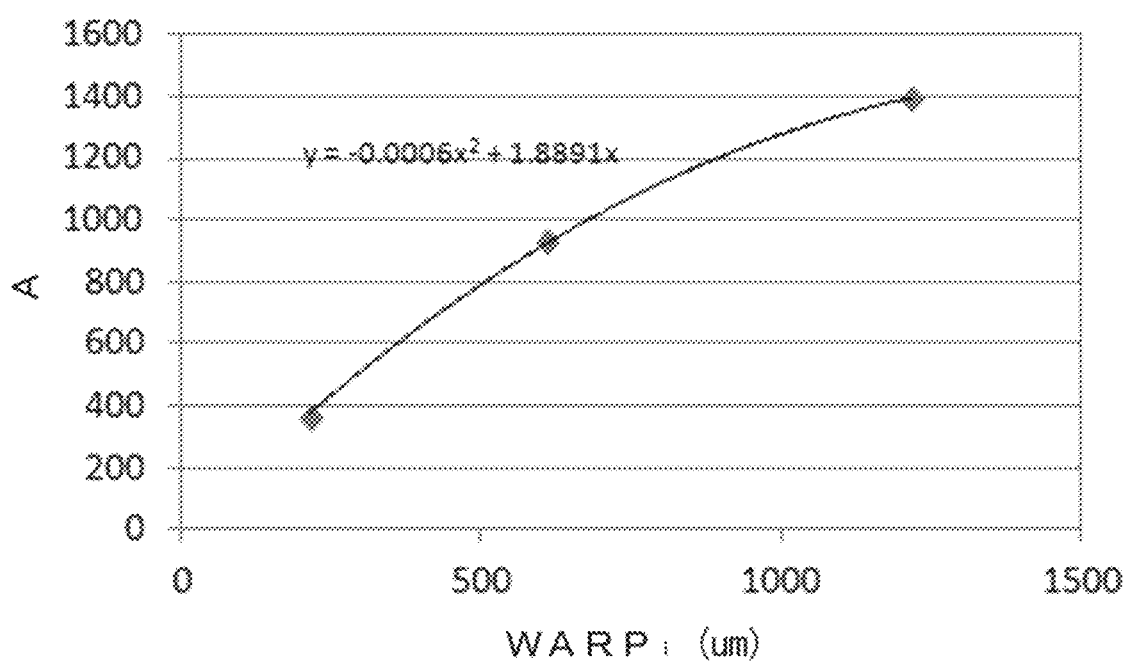
FIG. 12 is a graph illustrating the relationship between a constant A and a reference warpage amount $WARP_i$.

The graph of FIG. 11 is represented by the relational formula between the thickness (x) of the silicon wafer and the warpage reduction amount (y): y=A(x/775−1), and the constant A is set to a function of the reference warpage amount $WARP_i$ as illustrated in FIG. 12. As a result, the following formula is obtained.

$$A = -0.0006 \times WARP_i^2 + 1.8891 \times WARP_i \quad \text{(formula 4)}$$

The reference warpage amount $WARP_i$ refers to the amount of warpage when the wafer has the standard thickness (775 μm), and the reference warpage amounts $WARP_i$ when the thicknesses of the silicon oxide films are 0.5 μm, 1 μm and 2.0 μm (thicknesses of the silicon nitride films are 0.24 μm, 0.7 μm and 1.4 μm) are 213 μm, 608 μm and 1217 μm, respectively. As is clear from FIG. 12, the constant A is not proportional to the increase in the reference warpage amount $WARP_i$ but is saturated, and when the silicon wafer is warped in a saddle shape, the constant A is equal to or less than 1500.

From the relational formula between the constant A and the reference warpage amount $WARP_i$, the constant A when the reference warpage amount $WARP_i$ is 213 μm becomes 362.54. Thus, the relational formula between the thickness x of the silicon wafer and the warpage reduction amount y is y=362.54(x/775−1).

Then, a confirmation experiment was performed using the above relational formula. When the target warpage reduction amount y=20 μm is substituted into the relational formula: y=362.54(x/775−1), the target thickness x of the silicon wafer=817.75 μm is obtained. Then, when a silicon wafer having a diameter of 300 mm and a thickness of 817.6 μm was prepared, and a silicon oxide film having a thickness of 0.5 μm was formed thereon by the CVD process, a convex bowl-shaped warp occurred in the wafer. The amount of warpage was 191.8 μm. The actual warpage reduction amount was 213−191.8=21.2 μm. Since the target warpage reduction amount is y=20 μm, the obtained result nearly complies with the target value.

DESCRIPTION OF THE SYMBOLS

S1: Step of calculating relationship between amount of warpage occurring in silicon wafer and thickness of silicon wafer (first step)

S2: Step of calculating relational formula between warpage reduction amount of silicon wafer and target thickness (x) of silicon wafer (second step)

S3: Step of calculating silicon wafer target thickness by substituting desired warpage reduction amount into relational formula (third step)

S4: Step of manufacturing silicon wafer having target thickness (fourth step).

What is claimed is:

1. A silicon wafer manufacturing method comprising:
   calculating a target thickness of a silicon wafer required for ensuring a warpage reduction amount of the silicon wafer warped during a device process from a relationship between an amount of warpage of a silicon wafer and a thickness of the silicon wafer occurring due to application of the same film stress to a plurality of silicon wafers having mutually different thicknesses; and
   processing a silicon single crystal ingot to thereby manufacture silicon wafers having the target thickness.

2. The silicon wafer manufacturing method as claimed in claim 1 calculates a relational formula between the warpage reduction amount of the silicon wafer warped during a device process and the target thickness of the silicon wafer from the relationship between the amount of warpage of the silicon wafer and the thickness thereof, and calculates the target thickness of the silicon wafer by substituting the warpage reduction amount into the relational formula.

3. The silicon wafer manufacturing method as claimed in claim 2, wherein the relational formula satisfies y=A(x/t−1), where y is the warpage reduction amount of the silicon wafer, x is the target thickness of the silicon wafer, t is a standard thickness of the silicon wafer, and A is a constant.

4. The silicon wafer manufacturing method as claimed in claim 3, wherein the constant A is a value according to the amount of warpage of the silicon wafer occurring due to a device process.

5. The silicon wafer manufacturing method as claimed in claim 3, wherein when the shape of the warp of the silicon wafer occurring due to a difference in the stress component of the films laminated during device formation is a bowl shape, the constant A is equal to or less than 900.

6. The silicon wafer manufacturing method as claimed in claim 3, wherein when the shape of the warp of the silicon wafer occurring due to a difference in the stress component of the films laminated during device formation is a saddle shape, the constant A is equal to or less than 1500.

7. The silicon wafer manufacturing method as claimed in claim 1, wherein the relationship between the amount of warpage of the silicon wafer and the thickness thereof includes the relationship between the amount of warpage of a silicon wafer having the standard thickness t and the standard thickness t.

8. The silicon wafer manufacturing method as claimed in claim 1, wherein the device is a 3DNAND flash memory.

* * * * *